United States Patent [19]

Dumoulin et al.

[11] Patent Number: 5,541,512

[45] Date of Patent: Jul. 30, 1996

[54] METHOD FOR THE PREVENTION OF REGISTRATION ARTIFACTS DUE TO MOTION IN MAGNETIC RESONANCE IMAGES

[75] Inventors: Charles L. Dumoulin, Ballston Lake; Robert D. Darrow, Scotia, both of N.Y.

[73] Assignee: General Electric Company, Schenectady, N.Y.

[21] Appl. No.: 313,957

[22] Filed: Sep. 28, 1994

[51] Int. Cl.$^6$ .................................. G01V 3/00; G01V 3/14
[52] U.S. Cl. ........................... 324/309; 324/306; 324/307
[58] Field of Search ................................... 324/306, 307, 324/309, 310, 314

[56] References Cited

U.S. PATENT DOCUMENTS

| | | | |
|---|---|---|---|
| 4,654,591 | 3/1987 | Moran | 324/306 X |
| 4,718,424 | 1/1988 | Nishmura | 324/306 X |
| 5,007,426 | 4/1991 | LeRoux | 324/306 X |

OTHER PUBLICATIONS

"Elimination of Oblique Flow Artifacts in Magnetic Resonance Imaging" by L. R. Frank, A. P. Crawley, R. B. Buxton, Magn. Reson. in Med. 25: 299–307 (1992).

*Primary Examiner*—Sandra L. O'Shea
*Assistant Examiner*—Mack Haynes
*Attorney, Agent, or Firm*—Lawrence P. Zale; Marvin Snyder

[57] ABSTRACT

A magnetic resonance system employs a sequence of radio frequency pulses and magnetic field gradients to generate a flow-compensated image of a selected portion of a sample. Flow-compensation is performed with an oscillating readout gradient waveform which is comprised of two components. The first component is a constant amplitude gradient waveform whose amplitude is determined by the desired field-of-view and the bandwidth of the imaging system. The second component is an oscillating waveform whose amplitude, frequency and phase are chosen to obtain the desired degree of flow-compensation. The frequency of the oscillating waveform is typically chosen to match the sampling frequency of the imaging system. In effect, each acquired data point is preceded by the application of a bi-polar magnetic field gradient pulse which causes a phase shift in the acquired signal which is proportional to nuclear spin velocity. The amplitude is typically chosen to cause an incremental phase shift which when repeatedly added to the acquired MR response signal at the sampling rate causes a frequency modulation. This frequency modulation, in turn, induces a spatial displacement of signal intensity in the readout dimension which corresponds to the displacement of spin magnetization during the interval between the phase-encoding and frequency-encoding.

4 Claims, 4 Drawing Sheets

METHOD FOR THE PREVENTION OF REGISTRATION ARTIFACTS DUE TO MOTION IN MAGNETIC RESONANCE IMAGES

BACKGROUND OF THE INVENTION

1. Field of the Invention

The present invention relates to the fields of nuclear magnetic resonance spectroscopy and magnetic resonance (MR) imaging.

2. Discussion of Prior Art

Presently, the acquisition of Magnetic Resonance (MR) images is a useful procedure in the diagnosis of many diseases in humans. In these procedures a subject is placed in a magnet causing resonating nuclei of the subject, or "nuclear spins", to generate longitudinal spin magnetization. In a common procedure, this magnetization is detected by the application of a radio-frequency (RF) pulse capable of nutating the longitudinal spin magnetization by a selected amount to create transverse spin magnetization. Maximum transverse spin magnetization is generated by the application of a 90° nutation. Unlike longitudinal magnetization, transverse spin magnetization is capable of inducing a signal in a receiver coil placed near the sample.

The signal induced in a receiver coil carries significant information about the local environment of signal generating nuclei. If the signal is acquired in a homogeneous magnetic field, the spectral components of the signal can be resolved to provide a nuclear magnetic spectrum in which different peaks arise from populations of nuclei in different molecules (or parts of a molecule).

If the spatial distribution of transverse spin magnetization is to be measured, as in MR Imaging (MRI), the transverse spin magnetization can be phase shifted with the application of magnetic field gradient pulses of selected intensities and durations. These gradient-induced phase shifts encode the position of spin magnetization within the magnet. Two or three-dimensional images of the distribution of spin magnetization can be generated by repeating the sequence of RF and magnetic field gradient pulses and acquiring the MR signal responsive to a collection of magnetic field gradient intensities.

In typical imaging pulse sequences image dimensions are obtained responsive to either a frequency-encoding (sometimes called readout) gradient pulse or a phase-encoding gradient pulse. It is possible to apply two phase-encoding gradient pulses simultaneously in different selected directions. By necessity, however, a frequency-encoding pulse cannot be applied simultaneously with a phase-encoding pulse. Consequently, position measurement in the frequency-encoding and phase-encoding dimensions cannot occur at the same instant in time. While this is not a problem when the imaged objects are stationary, it creates a registration artifact for those nuclear spins which are moving with velocity components in both the frequency and phase-encoding dimensions. This effect can create significant image distortions in the region of flowing blood within a subject.

A method currently in use which minimizes artifacts due to motion is the incorporation of flow-compensation gradient waveforms into the imaging pulse sequence. These waveforms are applied between the excitation RF pulse and data detection. The shape of the waveform is chosen to cause the first moment of the entire gradient waveform with respect to some time, t, to be zero. Flow-compensation gradient waveforms are used to minimize or eliminate phase shifts arising from motion during the slice-select, phase-encoding and frequency-encoding portions of an imaging pulse sequence. Correction of misregistration artifacts can be accomplished by incorporating flow-compensated gradient waveforms into both the frequency- and phase-encoding gradient waveforms. Incorporation of these compensation waveforms, however, increases the minimum echo time, TE, and cannot be used with bi-polar phase-encoding gradient waveforms such as those used to acquire Fourier velocity encoded images. A complete as description of flow-compensation waveforms can be found in "Elimination of Oblique Flow Artifacts in Magnetic Resonance Imaging" by L. R. Frank, A. P. Crawley, R. B. Buxton, *Magn. Reson. in Med.* 25: 299–307 (1992) ("Frank publication").

OBJECTS OF THE INVENTION

An object of the present invention is to provide a system which is capable of obtaining magnetic resonance images which are free of misregistration artifacts due to movement of spin magnetization.

Another object of the present invention is to provide a method in which misregistration of signal intensity due to motion is eliminated in magnetic resonance images.

SUMMARY OF THE INVENTION

In the present invention, a subject is placed in the magnetic field generated by a Magnetic Resonance Imaging (MRI) system. One or more MR images are obtained using a selected imaging pulse sequence. This imaging pulse sequence differs from a conventional pulse sequence in that a novel frequency encoding gradient waveform is used during acquisition of data. This novel frequency encoding pulse is created by combining a constant value gradient waveform (such as those currently used in the art) with an oscillating gradient waveform. The amplitude of the constant value gradient waveform is determined by the desired field-of-view and the bandwidth of the imaging system. The amplitude, frequency and phase of the oscillating waveform are chosen to obtain the s desired degree of artifact compensation. The frequency of the oscillating waveform is typically chosen to match the sampling frequency of the imaging system. In effect, each acquired data point is preceded by the application of a bi-polar magnetic field gradient pulse which causes a phase shift in the acquired signal which is proportional to nuclear spin velocity. The constant of proportionality is typically chosen to cause an incremental phase shift, $\phi$, which when repeatedly added to the acquired signal at the sampling rate causes a frequency modulation, F, in the acquired signal. This frequency modulation, in turn, induces a spatial displacement of signal intensity in the readout dimension which corresponds to the displacement of spin magnetization during the interval between the phase-encoding and frequency-encoding waveforms.

The novel frequency-encoding gradient waveform described here provides compensation of phase and registration artifacts due to nuclear spin motion, but in a different way than that found in the current state of the art. With this invention the time delay between the application of the RF pulse and the detection of the MR signal can be minimized since there is no additional flow-compensation gradient waveform. The present invention can also be used to correct registration artifacts in Fourier Velocity Encoded (FVE)

images which cannot be corrected with current flow-compensation gradient waveforms.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
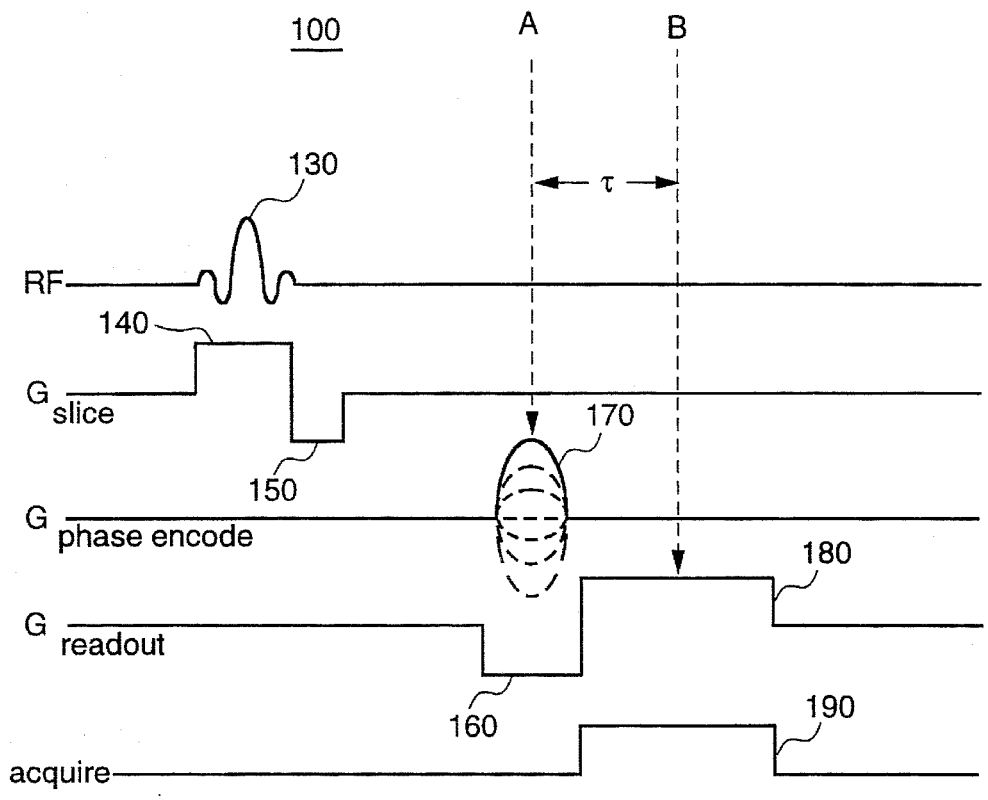
FIG. 1 is a timing diagram of a conventional gradient-recalled imaging MR imaging pulse sequence used to illustrate the origin of misregistration artifacts.

FIG. 1 is a timing diagram of a prior art MR pulse sequence illustrating the radio frequency and magnetic field gradients of gradient-recalled magnetic resonance imaging. Pulse sequence 100 consists of a detection RF pulse 130 which is applied in the presence of a slice selective magnetic field gradient pulse 140. Detection pulse 130 nutates spin magnetization in a selected portion of the subject. The amount of nutation can be selected by selecting the duration and amplitude of detection RF pulse 130. Maximum transverse magnetization is most often obtained with a nutation angle of 90 degrees provided that the delay between successive applications of detection pulse 130 is long with respect to the longitudinal relaxation time, $T_1$, of the nuclear spins. The location and size of the selected portion can be adjusted by appropriate selection of the frequency and bandwidth of RF pulse 130 and the amplitude of slice selective magnetic field gradient pulse 140.

After detection RF pulse 130 and slice selective magnetic s field gradient pulse 140 are applied, a slice refocusing magnetic field gradient pulse 150 is applied. Slice refocusing gradient pulse 150 has an amplitude and duration which is selected to cause all transverse spin magnetization within the selected portion of the subject to be substantially in phase after the application of slice selective magnetic field gradient pulse 140. In the present embodiment, the product of the amplitude and duration of slice refocusing gradient pulse 150 is substantially half that of the negative of the product of the amplitude and duration of slice selective gradient pulse 140 in a manner well known to those skilled in the art.

After slice refocusing gradient pulse 150, a frequency-dephasing gradient pulse 160 is applied in a selected direction. Frequency-dephasing pulse 160 dephases spin magnetization such that the amount of dephasing is proportional to the position of nuclear spin magnetization along the direction of the frequency-dephasing pulse. Substantially simultaneously with frequency-dephasing pulse 160 a phase-encoding pulse 170 of a selected amplitude and duration is applied in a direction substantially orthogonal to the direction of the frequency-dephasing gradient pulse. After frequency-dephasing pulse 160 and phase-encoding pulse 170 are applied a frequency-encoding magnetic field gradient pulse 180 is applied in substantially the same direction as frequency-dephasing pulse 160, but with opposite polarity. During the application of frequency-encoding gradient 180 a data acquire signal pulse 190 is sent to a data acquisition subsystem which is part of the magnetic resonance system. MR signals are digitized during data acquire pulse 190. Since the MR signals coming from transverse spin magnetization within the subject are acquired in the presence of a magnetic field gradient, each detected MR signal will have a frequency which is determined by its position along the frequency-encoding gradient The location of each signal source can be determined by applying a Fourier transformation to the acquired signal data in a fashion well known to those skilled in the art.

Pulse sequence 100 is applied to the sample Y times where Y is a whole number greater than zero. In each of the Y applications, the amplitude of the phase-encoding pulse is chosen to induce a phase-shift proportional to the position of nuclear spins in the direction of the applied phase-encoding gradient 170.

Once data has been collected responsive to Y repetitions of pulse sequence 100, the data can be Fourier transformed in the phase-encoding direction in a fashion well known to those skilled in the art to resolve the spatial distribution of nuclear spin magnetization along the phase-encoding direction.

Figure 2:
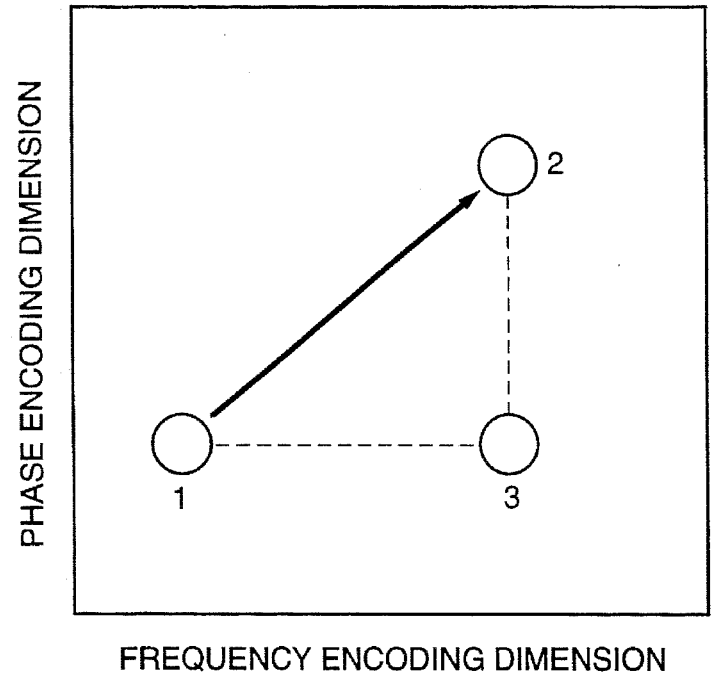
FIG. 2 is an illustration of moving nuclear spin magnetization as it relates to the formation of registration artifacts in MR imaging.

FIG. 2 illustrates the source of misregistration artifacts which arise in a conventional magnetic resonance imaging pulse sequence such as that illustrated in FIG. 1. In a conventional pulse sequence the position of a nuclear spin in the phase-encoding dimension is determined at time A of FIG. 1. The position of the same nuclear spin in the frequency-encoding dimension, however, is determined at time B. There is no artifact if the nuclear spins do not move substantially in the period between times A and B. If there is a change in position during this period, however, the situation illustrated in FIG. 2 can exist. Here a nuclear spin moves from position 1 to position 2 during the interval between times A and B. The position of the nuclear spin in the phase-encoding and frequency-encoding dimensions are determined at slightly different times and the resulting image contains spin density information at position 3 rather than at the true position (1 or 2 depending on when the measurement is made).

Figure 3:
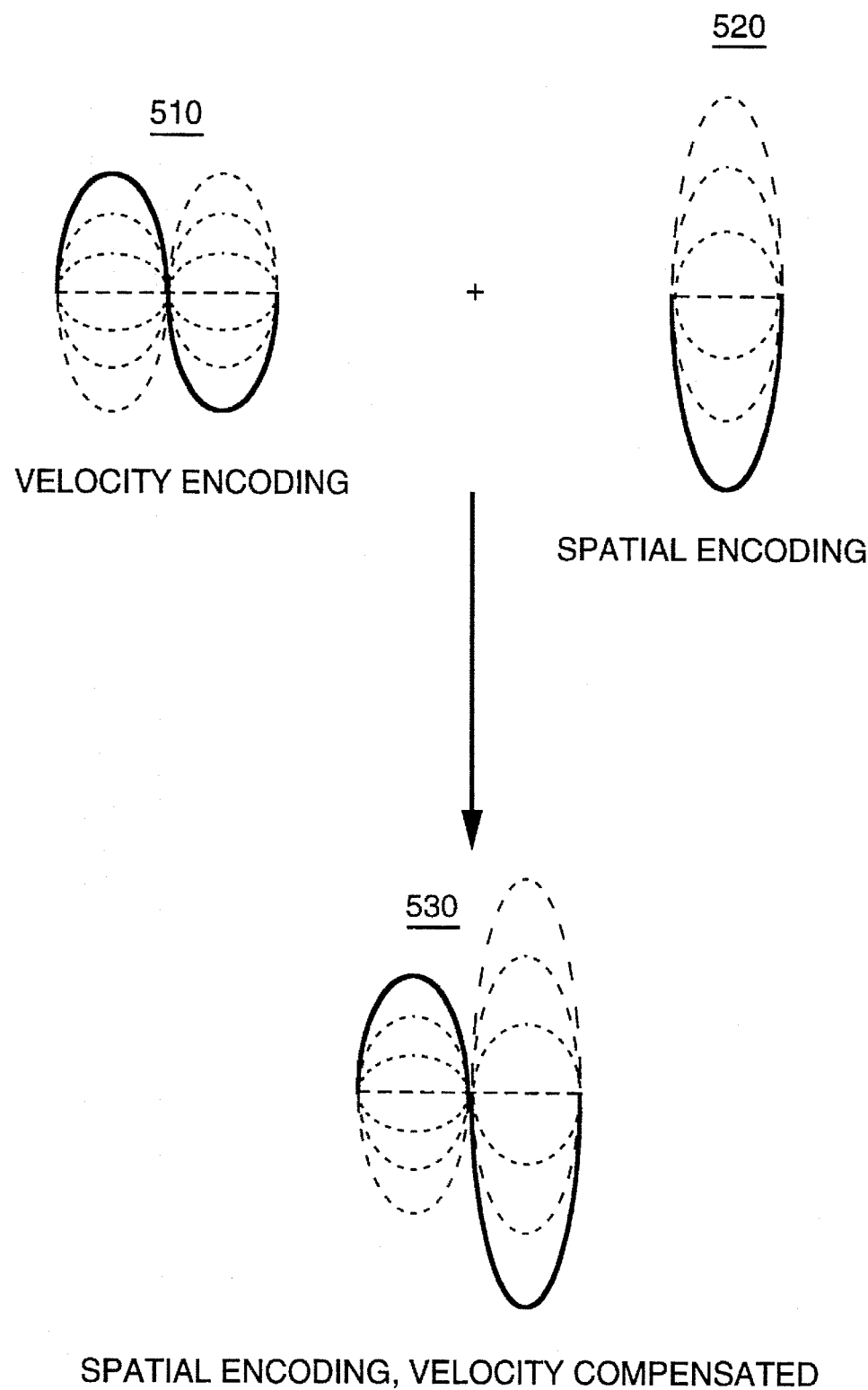
FIG. 3 illustrates construction of a flow-compensated phase-encoding pulse from velocity-encoding and spatial phase-encoding gradient pulses.

This misregistration can be overcome by combining a velocity encoding gradient pulse 510 with the single-lobed phase-encoding pulse 520 to give a velocity-compensated phase-encoding pulse 530 as described in Frank publication, id., and is illustrated in FIG. 3. Here the first moment of the bi-polar velocity-encoding pulse varies with the amplitude of the spatial phase-encoding pulse as to cause an additional phase shift to the signal which is proportional to velocity. The first moment, M, required to correct misregistration by the largest phase-encoding gradient pulse can be expressed as:

$$M = TA_g \frac{\pi Y_{res}}{\gamma F} \qquad [1]$$

where T is the time between lobes of the bi-polar velocity gradient pulse, $A_g$ is the area of each lobe of the bi-polar pulse, $Y_{res}$ is the number of phase-encoding steps, $\tau$ is the time delay between times A and B (shown in FIG. 1), $\gamma$ is the gyromagnetic ratio of the nuclear spin and F is the field-of-view of the MR image.

Flow compensation of the phase-encoding gradient effectively shifts the position of moving spins in the image to the position that the spin has at the moment of frequency encoding. There are several disadvantages to this method, however. For example, the incorporation of a velocity encoding gradient pulse into the phase-encoding waveform increases the echo time, TE. This is particularly a problem for Magnetic Resonance Angiography (MRA) (both time-of-flight and phase-sensitive methods) where minimum TE echo times are necessary to minimize voxel dephasing due to spin motion. In addition to increasing TE, the repetition time, TR, of the pulse sequence is increased. While not necessarily a problem for some forms of MRI, minimum TR is important for fast imaging and phase-sensitive MRA. Another limitation of flow-compensated phase-encoding occurs when phase-encoding is used to encode a parameter other than position (e.g. velocity or acceleration). In this case a flow-compensated phase-encoding waveform cannot be created.

Figure 4:
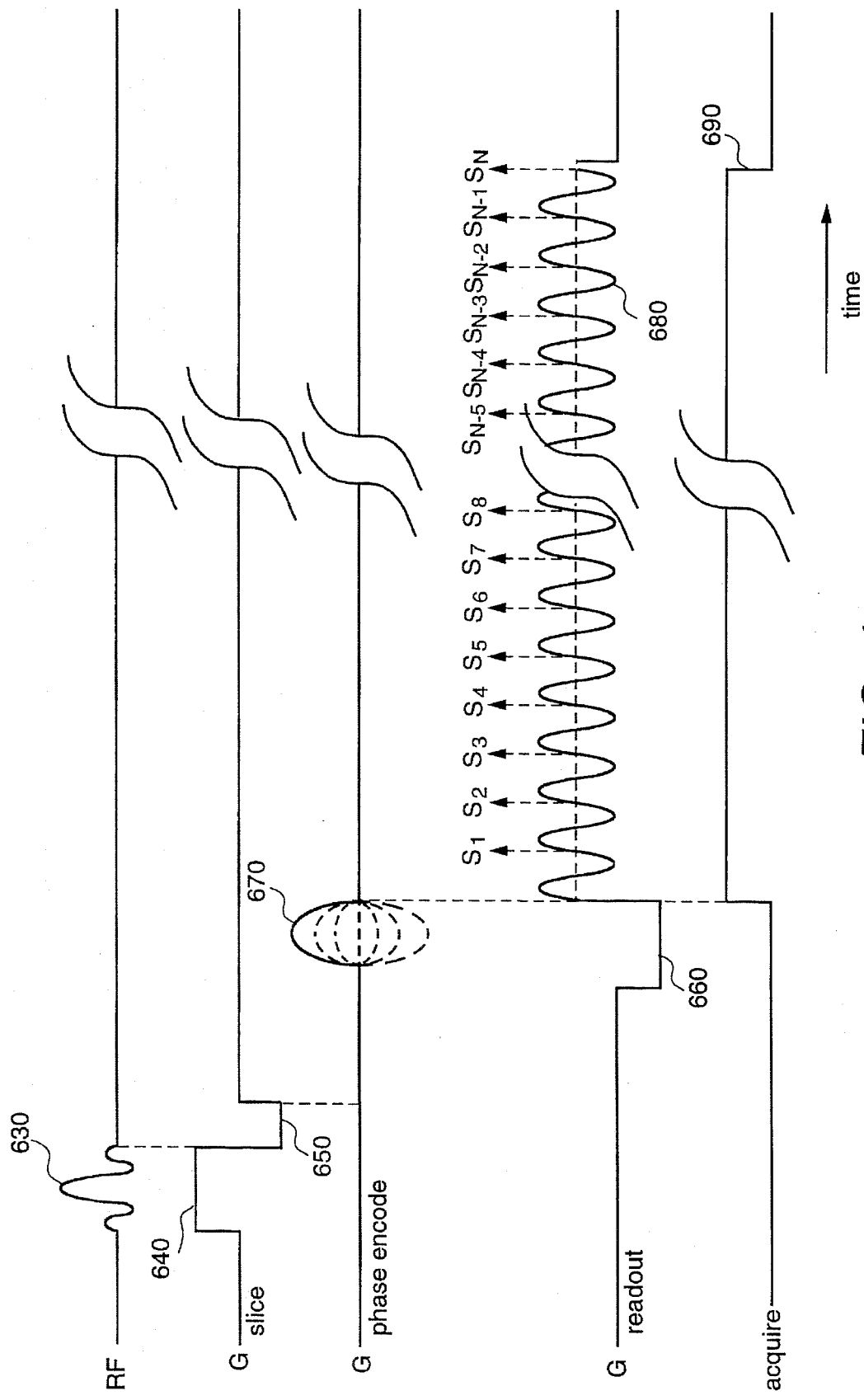
FIG. 4 is a timing diagram of an MR pulse sequence compatible with the present invention employing an oscillating amplitude readout gradient pulse.

In FIG. 4, a spin-warp pulse sequence employing an oscillating amplitude readout gradient is shown. Note that although the pulse sequence shown here yields a two-dimensional gradient echo image, almost any MRI pulse sequence yielding a 1, 2, 3, . . . dimensional MR spatial mapping can be used. In this invention the oscillating readout gradient pulse has two components. The first is a constant component which is identical to the constant component used in conventional imaging. This component, along with the sampling rate, determines the field-of-view in the frequency dimension.

The second component is a series of oscillations in amplitude, or bi-polar variations of the readout gradient amplitude, placed between each sampled data point which are acquired at times $S_1, S_2, S_3, \ldots, S_N$ indicated by the arrows. Each bi-polar gradient pulse imparts an incremental phase shift to the MR response signal which is proportional to its velocity. This repeated phase shift for each sampled point effectively changes the frequency, f, of the detected MR response signal. The change is chosen to cause a translation in the frequency encoding dimension which is identical to the actual displacement of the spin in the time interval between times A and B of FIG. 1. Note that the imaged location of the spin is the location of the spin at the instant of phase-encoding (point 1 in FIG. 2) and not the location of the nuclear spin at the instant of frequency-encoding (point 2 in FIG. 2).

The size of the oscillations needed to correct misregistration can be determined by considering the following:

The change in frequency, $\Delta f$, caused by displacement of a signal component by a distance, D, in the frequency encoded dimension can be expressed in terms of the bandwidth, W, of the image and the field-of-view, F, as:

$$\Delta f = \frac{WD}{F} \quad [2]$$

The distance, D, of spin travel during the interval, t, between times A and B is simply the product of spin velocity, V, and t and can be expressed as:

$$D = V\tau \quad [3]$$

which can be substituted into equation [2] to give:

$$\Delta f = \frac{WV\tau}{F} \quad [4]$$

The phase shift, $\Theta$, which is created during each sampling period $T_s$ by $\Delta f$ is:

$$\Theta = 2\pi \Delta f T_s \quad [5]$$

where $$T_s = \frac{1}{W} \quad [6]$$

It is desirable to make this phase shift $\Theta$ equal to that caused by nuclear spin velocity in a selected direction which is substantially parallel to a bi-polar velocity-encoding gradient which is described as:

$$\Theta = \gamma V T A_g \quad [7]$$

where $\gamma$ is the gyromagnetic ratio, V is the spin velocity, T is the time between lobes in the bi-polar gradient and $A_g$ is the area of each lobe. Combining equations [5], [6] and [7] the first moment required to correct the displacement becomes:

$$TA_g = \frac{2\pi\tau}{\gamma F} \quad [8]$$

Thus, the amplitude, Amp, of the oscillating component of the oscillating readout gradient, is:

$$\text{Amp} = \frac{2\pi\tau}{\gamma F T^2}, \quad [9]$$

and since $T=\tau$ here:

$$\text{Amp} = \frac{2\pi}{\gamma F \tau}. \quad [10]$$

A presently preferred embodiment of the present invention is illustrated in FIG. 4. Here an oscillating amplitude readout gradient pulse is used for frequency encoding in a gradient-recalled imaging pulse sequence. Pulse sequence 600 consists of an RF excitation pulse 630 which is applied in the presence of a slice selective magnetic field gradient pulse 640. Excitation pulse 630 nutates spin magnetization in a selected portion of the subject. The amount of nutation can be selected by selecting the duration and amplitude of detection RF pulse 630. Maximum transverse magnetization is most often obtained with a nutation angle of 90 degrees provided that the delay between successive applications of detection pulse 630 is long with respect to the longitudinal relaxation time, $T_1$, of the nuclear spins. The location and size of the selected portion can be adjusted by appropriate selection of the frequency and bandwidth of RF pulse 630 and the amplitude of slice selective magnetic field gradient pulse 640.

After detection RF pulse 630 and slice selective magnetic field gradient pulse 640 are applied, a slice refocusing magnetic field gradient pulse 650 is applied. Slice refocusing gradient pulse 650 has an amplitude and duration which is selected to cause all transverse spin magnetization within the selected portion of the subject to be substantially in phase after the application of slice selective magnetic field gradient pulse 640. In the present embodiment, the product of the amplitude and duration of slice refocusing gradient pulse 650 is substantially half that of the negative of the product of the amplitude and duration of slice selective gradient pulse 640 in a manner well known to those skilled in the art.

After slice refocusing gradient pulse 650 is applied, a frequency-dephasing gradient pulse 660 is applied in a selected direction. Frequency-dephasing pulse 660 dephases spin magnetization such that the amount of dephasing is proportional to the position of nuclear spin magnetization along the direction of the frequency-dephasing pulse. Substantially simultaneously with frequency-dephasing pulse 660 a phase-encoding pulse 670 of a selected amplitude and duration is applied in a direction substantially orthogonal to the direction of the frequency-dephasing gradient pulse. After frequency-dephasing pulse 660 and phase-encoding pulse 670 are applied, oscillating amplitude magnetic field readout gradient pulse 680 is applied in substantially the same direction as frequency-dephasing pulse 660, but with opposite polarity. Oscillating magnetic field readout gradient pulse 680 has a zeroth moment which is determined by a selected field-of-view. The amplitude of the constant component of the oscillating magnetic field gradient is chosen to cause the transverse spin magnetization to be substantially in phase at the selected time, TE, after RF detection pulse 630. The amplitude, Amp, of the as oscillations is determined using the mathematical relationships given in Eqs. [9] or [10]. The frequency of the oscillations, co, is equal to the inverse of the sampling period $T_s$. $\omega$ is also equal to the bandwidth of the image, W, as described by Eq. [6], and consequently:

$$\omega = \frac{1}{T_s} \,.$$
[11]

Figure 5:
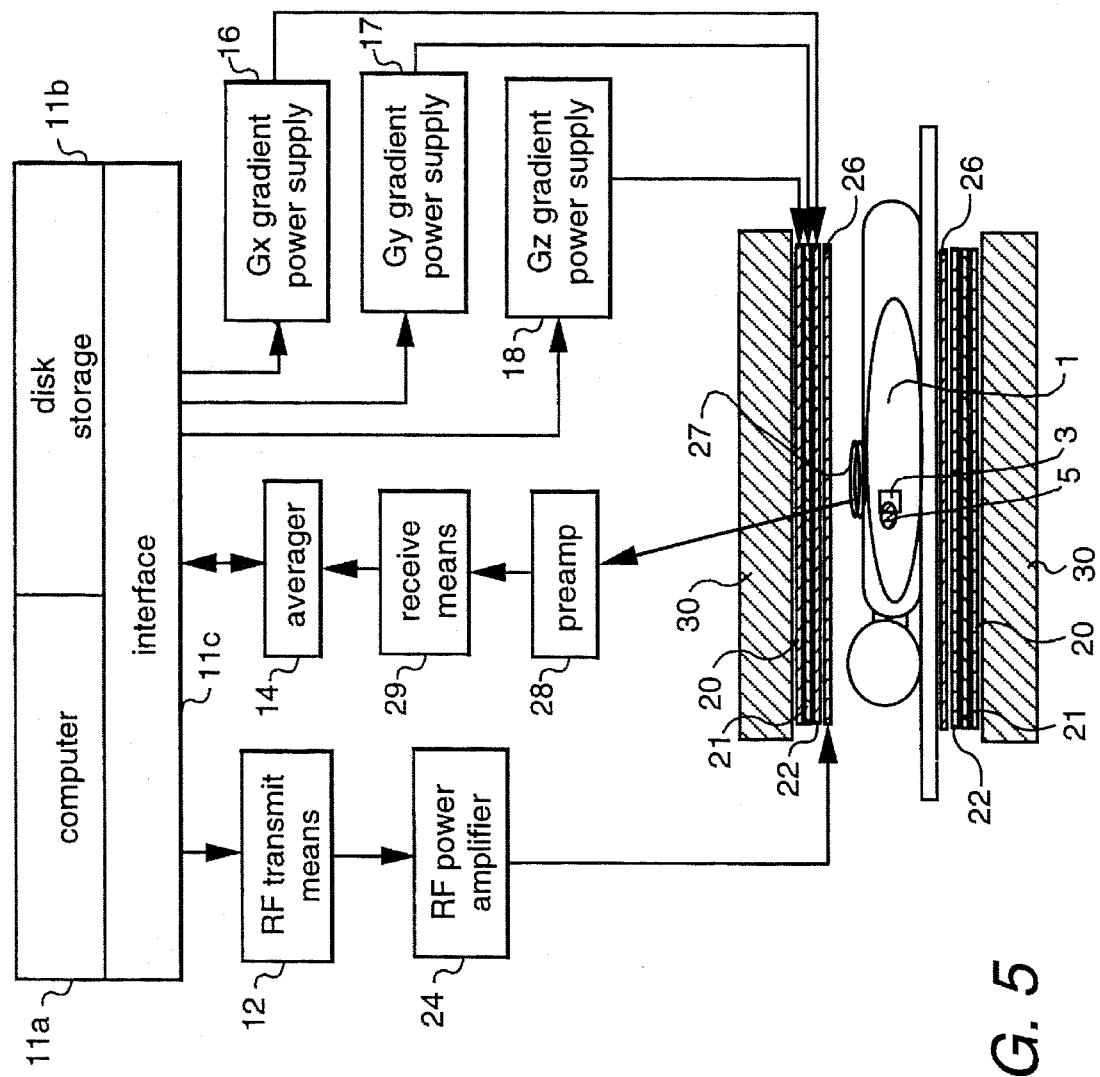
FIG. 5 is a simplified block diagram of a magnetic resonance (MR) imaging system suitable for use with the present invention.

During the application of oscillating readout gradient 680 a data acquire signal pulse 690 is sent to a preamplifier 28 and receive means 29 of FIG. 5 to allow acquisition of the MR response signal. MR signals are digitized during data acquire pulse 690 such that samples are acquired after each full oscillation of the oscillating readout gradient. Since the MR signals coming from transverse spin magnetization within the subject are acquired in the presence of a magnetic field gradient, each detected MR signal will have a frequency which is determined by its position along the oscillating readout gradient. The location of each signal source can be determined by applying a Fourier transformation to the acquired MR response signal data set in a fashion well known to those skilled in the art.

Pulse sequence 600 is applied to the sample Y times where Y is a whole number greater than zero. In each of the Y applications, the amplitude of phase-encoding pulse 670 is chosen to induce a phase-shift proportional to the position of nuclear spins in the direction of the applied phase-encoding gradient pulse.

Once data has been collected responsive to Y repetitions of pulse sequence 600, the data can be Fourier transformed in the phase-encoding direction in a fashion well known to those skilled in the art to resolve the spatial distribution of nuclear spin magnetization along the phase-encoding direction.

FIG. 5 is a simplified block diagram of the major components of an MR imaging system suitable for use with the MR pulse sequences of the invention described herein. The system is comprised of a general purpose mini-computer 11a which is functionally coupled to a disk storage unit 11b and an interface unit 11c. An RF transmit means 12, signal averager 14, and gradient power supplies 16, 17 and 18 for respectively energizing $G_x$, $G_y$, $G_z$ gradient coils 20, 21 and 22, are all coupled to computer 11a through interface unit 11c. FIG. 5 shows three gradient power supplies and gradient coils for producing magnetic field gradients in three mutually orthogonal directions.

RF transmit means 12 is gated with pulse envelopes from computer 11 to generate RF pulses having the required modulation to excite nuclear resonance of desired nuclei in the patient under study. For instance, if $^1H$ nuclei of water were being imaged, RF transmit means 12 would provide RF energy of a frequency to cause nutation of these nuclei.

The RF pulses are amplified in RF power amplifier 24 to levels varying from several watts to several kilowatts, depending on the imaging method, and applied to transmit coil 26. The higher power levels are necessary for large sample volumes, such as in whole body imaging, and where short duration pulses are required to excite the patient with large MR frequency bandwidths.

The MR response signal is sensed by receive coil 27, tuned to receive this frequency. The signal sensed by receive coil 27 is amplified in a low noise preamplifier 28 and applied for further amplification, detection, and filtering to a receive means 29. The signal is then digitized for averaging by a signal averager 14 and then reconstruction by computer 11. Preamplifier 28 and receive means 29 are protected from the RF pulses during transmission by active gating or by passive filtering.

Computer 11a provides gating and envelope modulation for the MR pulses, blanking for preamplifier 28 and RF power amplifier 24, and voltage waveforms for the gradient power supplies 16, 17, and 18. The computer also performs data processing such as Fourier transforms, imaging reconstruction, data filtering, imaging display, and storage functions (all of which are beyond the scope of the present invention). Computer 11a then constructs an MR image from the MR response signals.

The transmit and receive RF coils, if desired, may comprise a single coil. Alternatively, two separate coils that are electrically orthogonal may be used. The latter configuration has the advantage of reduced RF pulse breakthrough into receive means 29 during pulse transmission. In both cases, the coils generate magnetic fields that are orthogonal to the direction of a static magnetic field $B_o$ produced by a magnet means 30. The coils may be isolated from the remainder of the system by enclosure in an RF shielded cage.

Magnetic field gradient coils 20, 21 and 22 provide gradients $G_x$, $G_y$, and $G_z$, respectively. In the imaging pulse sequences described herein, the gradients should be monotonic and linear over the sample volume. Multivalued gradient fields cause a degradation in the MR response signal data sets, known as aliasing, which leads to image pixel intensity having signal intensity from more than one location. Nonlinear gradients may cause geometric distortions in the image, or in the shape of the voxels.

While several presently preferred embodiments of the novel method for the reduction and elimination of motion artifacts in MR images have been described in detail herein, many modifications and variations will now become apparent to those skilled in the art. It is, therefore, to be understood that the appended claims are intended to cover all such modifications and variations as fall within the true spirit of the invention.

What is claimed is:

1. A method of acquiring a magnetic resonance (MR) spatial map with reduced artifacts due to motion, within a subject comprising the steps of:

a) placing said subject in a magnetic field to generate longitudinal spin magnetization of nuclear spins having a gyromagnetic ratio, γ, within the subject;

b) applying a radio frequency (RF) pulse having a predetermined frequency range to convert longitudinal magnetization into transverse spin magnetization of a selected ensemble of nuclear spins;

c) applying a frequency-dephasing magnetic field gradient pulse in a selected direction to dephase transverse spin magnetization by an amount proportional to the spin magnetization's position in the selected direction;

d) applying an oscillating frequency-encoding magnetic field gradient pulse in the selected direction where in the oscillating frequency-encoding magnetic field gradient pulse consists of:
   i) a constant amplitude component whose amplitude is opposite in polarity to the frequency-dephasing magnetic field gradient pulse, and is determined by the selected field-of-view, F, and;
   ii) an oscillating component whose amplitude, Amp, and frequency are determined by an amount of motion to be compensated;

e) detecting, with a sampling period, $T_s$, during the application of the oscillating frequency-encoding magnetic field gradient pulse, magnetic resonance response signals generated by the transverse spin magnetization of the selected ensemble of nuclear spins;

f) creating a flow-compensated magnetic resonance spatial map from the detected magnetic resonance response signals.

2. The method of claim 1 wherein the frequency of oscillation, $\omega$, of the oscillating readout gradient is described by the sampling period, $T_s$, as described by:

$$\omega = \frac{1}{T_s}.$$

3. The method of claim 1 wherein the amplitude, Amp, of oscillation of the oscillating readout gradient is described by:

$$\text{Amp} = \frac{2\pi}{\gamma F \tau},$$

where $\tau$ is a time delay measured from substantially the center of the frequency-dephasing magnetic field gradient pulse to a time when the transverse spin magnetization is substantially in phase in response to the oscillating readout gradient.

4. The method of claim 1 further comprising, after the step of applying the RF pulse, applying a phase-encoding magnetic field gradient pulse in a second selected direction substantially orthogonal to the direction in which the oscillating frequency-encoding magnetic field gradient pulse is applied.

* * * * *